United States Patent [19]
Ellis et al.

[11] Patent Number: 6,075,475
[45] Date of Patent: Jun. 13, 2000

[54] METHOD FOR IMPROVED REPRODUCTION OF DIGITAL SIGNALS

[76] Inventors: Randy E. Ellis, 164 Nelson Street, Kingston Ontario, Canada, K7L 3X1; Nilanjan Sarkar, 2640 Dole St. Apt #D-5, Honolulu, Hi. 96822; Michael A. Jenkins, 67 Sydenham Street Apt 201, Kingston Ontario, Canada, K7L 3H2

[21] Appl. No.: 08/959,555
[22] Filed: Oct. 28, 1997

Related U.S. Application Data

[60] Provisional application No. 60/030,984, Nov. 15, 1996.

[51] Int. Cl.$^7$ .................................................. H03M 1/66
[52] U.S. Cl. ........................................... 341/144; 704/500
[58] Field of Search ............................... 341/144; 378/20; 704/210, 219, 223, 204, 265, 500; 708/313; 84/602

[56] References Cited

U.S. PATENT DOCUMENTS

| | | |
|---|---|---|
| 3,754,236 | 8/1973 | Dotson, Jr. . |
| 4,580,128 | 4/1986 | Ogita et al. . |
| 5,587,711 | 12/1996 | Williams et al. ........................ 341/144 |
| 5,814,750 | 9/1998 | Wang et al. .............................. 84/602 |
| 5,832,443 | 11/1998 | Kolesnik et al. ....................... 704/500 |

FOREIGN PATENT DOCUMENTS

| | | |
|---|---|---|
| 0569989 | 11/1993 | European Pat. Off. . |

*Primary Examiner*—Brian Young
*Assistant Examiner*—Patrick Wamsley
*Attorney, Agent, or Firm*—Lynn Schumacher; Hill & Schumacher

[57] ABSTRACT

The present invention provides a method for digital signal processing, referred to as sample-estimate-hold signal reconstruction, which provides a method of reconstructing output signals more representative of the original input analog signal than the conventional signal processing procedures used in D/A conversion, referred to as sample-hold signal reconstruction. The method uses the history of the analog signal being reconstructed from its digitized form to produce output values which reduce the absolute difference between the integral of the actual signal and the integral of its digital representation over local intervals in the range of the signal. The method is applicable to a wide range of signal processing applications including force-reflection systems, audio and data compression to mention just a few.

33 Claims, 8 Drawing Sheets

METHOD FOR IMPROVED REPRODUCTION OF DIGITAL SIGNALS

CROSS REFERENCE TO RELATED PATENT APPLICATION

This patent application relates to U.S. Provisional Patent Application Ser. No. 60/030,984, filed on Nov. 15, 1996, entitled METHOD FOR IMPROVED REPRODUCTION OF DIGITAL SIGNALS.

FIELD OF THE INVENTION

The present invention relates to a process for improved reconstruction of analog signals from digitally stored signals.

BACKGROUND OF THE INVENTION

Digital electronics are rapidly replacing their analog counterparts in many applications of signal processing such as consumer electronics, machine control, robotics, telephony, navigation to mention just a few. Also, computers using digital representations of signals are being used to process signals that may be acquired from an analog source or output to an analog device. Inherent in all these applications is the assumption that the underlying analog signal, such as sound, force, or light intensity, is being represented by a sequence of values corresponding to the amplitude of the signal sampled at fixed intervals. The discreet values are stored in digital format as a sequence of integers. In some applications, such as digital music on a compact disk, an entire signal is stored, but only fetched or examined value by value. In other applications, such as telephony and robotics control, the digital signal is transient and is being processed in real time.

In most applications of digital signal processing there are two conversion phases: 1) the original analog input signal is converted to a digital sequence by an A/D converter, and eventually, 2) a possibly altered digital sequence is converted to the output analog signal by a D/A converter. The input process is called sampling and is done at a frequency chosen for the application. The reconstructed analog output signal is generated by holding a constant voltage for each interval using the values in the digital sequence in turn. This sample-hold paradigm is inherent in D/A converters used in most digital electronic applications.

A basic limitation or drawback of the known methods of reconstruction of an analog signal from its digital representation is that the conversion process forces the output analog function to be a non-continuous piecewise constant function, but does not force the choice of the representing function.

An important technological area in which this type of digital processing limitation is problematic is in robotic force control. Specifically, when a robotic device is used to present a human operator with forces that simulate, for example, contact with a wall then it is commonly observed that the virtual wall feels "alive". Rather than the wall acting as a passive barrier, the virtual wall appears to exert a repulsive force so that the return signal coming back from the robot appears to have acquired energy not present in the collision with the wall. This failure to accurately simulate contact also occurs when the robot that presents the human operator with force is connected, via a digital link, with a remote robot that is commanded to interact with real objects and reports the force of interaction over the digital link. In both cases energy appears to have been acquired. The inventors have determined that the error in the energy is proportional to the square of the error in the force. Since the energy is determined by the force-time integral (area under the curve of the force signal) this suggests that finding a piecewise constant function that reduces the area difference with the original continuous signal would have superior behaviour in controlling the robot.

It would therefore be advantageous to provide a method of signal processing that gives an analog output signal reconstructed from a digital representation of the original analog input signal such that its integral more closely tracks the integral of the original input signal.

SUMMARY OF THE INVENTION

The object of the present invention is to provide a method of processing digital signals that gives a reconstructed analog output signal from its digital representation that is more closely representative of the original analog signal than is normally achievable using current signal processing procedures.

The present invention provides a method for digital signal processing, referred to as sample-estimate-hold signal reconstruction, which provides a method of reconstructing output signals more representative of the original input analog signal than the conventional signal processing procedures used in D/A conversion, referred to as sample-hold signal reconstruction. The method uses the history of the analog signal being reconstructed from its digitized form to produce output values which reduce the absolute difference between the integral of the actual signal and the integral of its digital representation over local intervals in the range of the signal.

In one aspect of the invention there is provided a method of reconstructing an analog signal from a digitized analog signal, comprising;

providing sample values $y_k$ of an analog signal function of time F(t) such that $y_k=F(t_0+kh)$ where h is the sampling interval, $t_0$ is the initial time and $k=0,1,2,\ldots,\mu$, defining a piecewise constant function of time given by $H(t)=y_k$, $t_k \leq t < t_{k+1}$;

constructing an output analog signal function $\tilde{F}(t)=\tilde{y}_k$, $t_k \leq t < t_{k+1}$, $k=0,1,2,\ldots,\mu$, by computing a sequence $\{\tilde{y}_k\}$ in real time using an effective numerical estimation technique so that an absolute difference given by $|\int \tilde{F}(t)dt - \int F(t)dt|$ is less than an absolute difference given by $|\int H(t)dt - \int F(t)dt|$ locally in intervals defined by a preselected number of previous sample values $y_k$; and outputting the reconstructed analog signal function $\tilde{F}(t)$ or storing the sequence $\{\tilde{y}_k\}$ in a digital storage medium for subsequent relieving and outputting in analog form.

In this aspect of the invention each term $\tilde{y}_k$ may be computed as a functional approximation of F(t) in an interval $[t_k, t_{k+1}]$ by calculating an estimation function $g_k(t)$ that predicts F(t) in the interval $[t_k, t_{k+1}]$ by using an effective number of previous values $y_k, y_{k-1}, \ldots$ and integrating the estimation function over the interval $[t_k, t_{k+1}]$ to give $$\int_{t_k}^{t_{k+1}} g_k(t)dt;$$

calculating a predicted value to hold using an equation $$y_k^p = \frac{1}{h}\left(\int_{t_k}^{t_{k+1}} g_k(t)dt\right);$$

calculating a correction term by using an estimation function $e_k(t)$ to estimate the integral in the previous interval $[t_{k-1}, t_k]$ and subtracting the predicted area estimation in that interval, the correction being given by $$y_k^c = \frac{1}{h}\left(\int_{t_{k-1}}^{t_k} e_k(t)dt - \int_{t_{k-1}}^{t_k} g_{k-1}(t)dt\right);$$

and
  adding the correction term to the predicted value to give a value for $y_k$ given by $$\tilde{y}_k = \frac{1}{h}\left(\int_{t_k}^{t_{k+1}} g_k(t)dt + \int_{t_{k-1}}^{t_k} e_k(t)dt - \int_{t_{k-1}}^{t_k} g_{k-1}(t)dt\right).$$

In this aspect of the invention the estimation function $g_k(t)$ may be equal to $p_k^m(t)$, which is the polynomial approximation of order m that fits F(t) at values $y_k, y_{k-1}, \ldots, y_{k-m}$, and wherein the estimation function $e_k(t)$ equals $p_k^n(t)$, which is the polynomial approximation of order n that fits F(t) at values $y_k, y_{k-1}, \ldots, y_{k-n}$.

In another aspect of the invention there is provided a method for compression of an analog signal. The method comprises
  a) sampling the analog signal at a first frequency $v_1$ or relieving from a storage medium an analog signal previously sampled at frequency $v_1$ to produce a digitized signal, filtering the digitized signal to remove frequencies above a preselected frequency, subsampling the filtered signal at a second frequency $v_2$ wherein $v_2<v_1$;
  b) reconstructing the analog signal from the digitized signal sampled at frequency $v_2$, by the steps of
  providing sample values $y_k$ of the analog signal of time F(t)such that $y_k=F(t_0+kh)$ where h is the sampling interval, $t_0$ is the initial time and $k=0,1,2,\ldots \mu$, defining a piecewise constant function of time given by $H(t)=y_k$, $t_k \leq t < t_{k+1}$
  constructing a sequence $\{\tilde{y}_k\}$ in real time where $\tilde{y}_k$, $k=0,1,2,\ldots \mu$ are computed values of a piecewise constant function of time $\tilde{F}(t)$ forming a reconstruction of said signal function such that $\tilde{F}(t)=\tilde{y}_k$, $t_k \leq t < t_{k+1}$, $k=0,1,2,\ldots \mu$, wherein said sequence $\{\tilde{y}_k\}$ is computed by using an effective numerical estimation technique so that an absolute difference given by $|\int \tilde{F}(t)dt - \int F(t)dt|$ locally in intervals defined by a preselected number of previous sample values $y_k$ is less than an absolute difference given by $|\int H(t)dt - \int F(t)d|$ over the same intervals; and
  c) outputting the reconstructed analog signal $\tilde{F}(t)$ or storing the sequence $\{\tilde{y}_k\}$ in a digital storage medium for subsequent relieving and outputting in analog form.

The present invention provides a method of reconstructing an analog signal from a digitized analog signal, comprising;
  providing sample values $y_k$ of an analog signal function of time F(t) such that $y_k=F(t_0+kh)$ where h is the sampling interval, $t_0$ is the initial time and $k=0,1,2,\ldots \mu$;
  constructing an output analog signal function $\tilde{F}(t)=\tilde{y}_k$, $t_k \leq t < t_{k-1}$, $k=0,1,2,\ldots \mu$, by computing a sequence $\{\tilde{y}_k\}$ in real time, wherein each term $y_k$ is computed as a functional approximation of F(t) in an interval $[t_k, t_{k+1}]$ by the steps of
  calculating an estimation function $g_k(t)$ that predicts F(t) in the interval $[t_k, t_{k+1}]$ using an effective number of previous values $y_k, y_{k-1}, \ldots$ and integrating the estimation function over the interval $[t_k, t_{k+1}]$ to give $$\int_{t_k}^{t_{k+1}} g_k(t)dt,$$

and
calculating a predicted value to hold$y_k^p$ given by $$y_k^p = \frac{1}{h}\left(\int_{t_k}^{t_{k+1}} g_k(t)dt\right),$$

calculating a correction term by using an estimation function $e_k(t)$ to estimate the integral in the previous interval $[t_{k-1}, t_k]$ and subtracting the predicted area estimation in that interval, the correction being given by $$y_k^c = \frac{1}{h}\left(\int_{t_{k-1}}^{t_k} e_k(t)dt - \int_{t_{k-1}}^{t_k} g_{k-1}(t)dt\right),$$

and
  adding the correction term to the predicted value to give a value for $\tilde{y}_k$ given by $$\tilde{y}_k = \frac{1}{h}\left(\int_{t_k}^{t_{k+1}} g_k(t)dt + \int_{t_{k-1}}^{t_k} e_k(t)dt - \int_{t_{k-1}}^{t_k} g_{k-1}(t)dt\right); \text{ and}$$

outputting the reconstructed analog signal function $\tilde{F}(t)$ or storing the sequence $\{\tilde{y}_k\}$ in a digital storage medium for subsequent relieving and outputting in analog form.

In another aspect of the invention there is provided a computational method of calculating force reflection in force-reflecting systems. The method comprises the steps of
  providing sample values $y_k$ of an analog signal function of time F(t)such that $y_k=F(t_0+kh)$ where h is the sampling interval, to is the initial time and $k=0,1,\ldots$;
  constructing a sequence $\{\tilde{y}_k\}$ in real time where $\tilde{y}_k$, $k=0,1,2,\ldots$, are computed values of a piecewise constant function of time F(t) that is a reconstruction of said continuous force function such that $\tilde{y}_k=\tilde{F}(t_0+kh)$, each term $\tilde{y}_k$ in said sequence $\{\tilde{y}_k\}$ being computed as a functional approximation of F(t) in an interval $[t_k, t_{k+1}]$ by
  I) calculating an estimation function $g_k(t)$ that predicts F(t) over the interval $[t_k, t_{k+1}]$ by using sufficient previous values $y_k, y_{k-1}, \ldots$ and integrating the estimation function over the interval $[t_k, t_{k+1}]$ to give $$\int_{t_k}^{t_{k+1}} g_k(t)dt$$

to determine a predicted value to hold:

$$y_k^p = \frac{1}{h}\left(\int_{t_k}^{t_{k+1}} g_k(t)dt\right),$$

ii) calculating a correction term by using an estimation function $e_k(t)$ to estimate the integral in the previous interval $[t_{k-1}, t_k]$ and subtracting the predicted area estimation in that interval, the correction being given by $$y_k^c = \frac{1}{h}\left(\int_{t_{k-1}}^{t_k} e_k(t)dt - \int_{t_{k-1}}^{t_k} g_{k-1}(t)dt\right),$$

iii) adding the correction term to said predicted value to give a value for $\tilde{y}_k$ given by $$\tilde{y}_k = \frac{1}{h}\left(\int_{t_k}^{t_{k+1}} g_k(t)dt + \int_{t_{k-1}}^{t_k} e_k(t)dt - \int_{t_{k-1}}^{t_k} g_{k-1}(t)dt\right),$$

and iv) outputting the reconstructed analog signal function $\tilde{F}(t)$.

BRIEF DESCRIPTION OF THE DRAWINGS

The improved process for digital signal processing will now be described, by way of example only, reference being had to the accompanying drawings, in which.

DETAILED DESCRIPTION OF THE INVENTION

Figure 1:
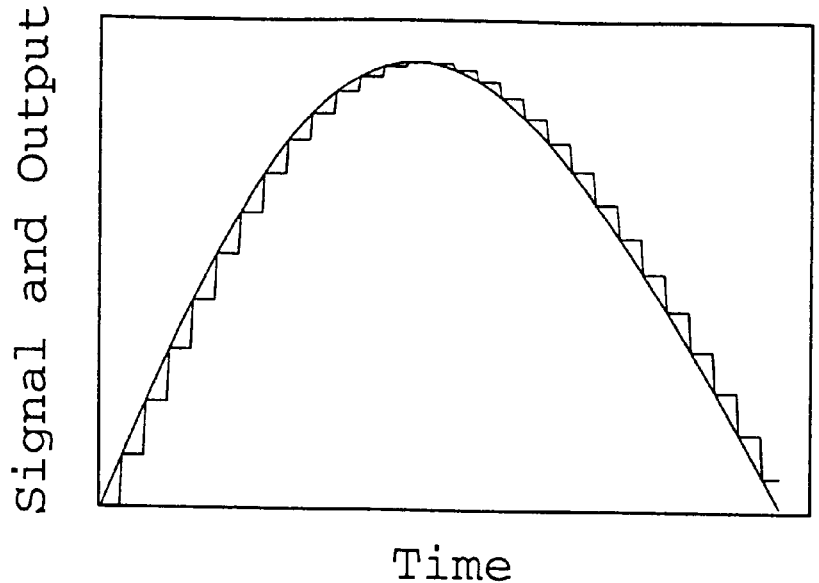
FIG. 1 shows a continuous function and its digital reproduction by a piecewise constant function according to the method of the prior art.

As stated above, from a mathematical perspective, the D/A conversion process involves an underlying continuous function being represented by a piecewise constant function. FIG. 1 shows a continuous function and its reproduction with the piecewise constant function, being the prior art sample-hold method.

The problem can be stated mathematically as follows:
Let $y_k$, $k=0,1,2,\ldots\mu$, be the sample values of some continuous signal function of time $F(t)$ such that $y_k=F(t_0+kh)$ where $h$ is the sampling interval, and $t_0$ is the initial time. Let $H(t)$ be the piecewise constant function of time such that $H(t)=y_k$, $t_k \leq t < t_{k+1}$, $k=0,1,2,\ldots\mu$. $H(t)$ is the output analog function using the sample-hold method. Let $\tilde{F}(t)$ be the piecewise constant function of time such that $\tilde{F}(t)=\tilde{y}_k$, $t_k \leq t < t_{k+1}$, $k=0,1,2,\ldots\mu$. $\tilde{F}(t)$ is the output analog function to be constructed using the sample-estimate-hold method. The problem is to choose the sequence $\{\tilde{y}_k\}$ so that an absolute difference $|\int \tilde{F}(t)dt - \int F(t)dt|$ locally over intervals involving a few sample points is smaller than an absolute difference $|\int H(t)dt - \int F(t)dt|$ over the same intervals.

In order to construct the sequence $\{\tilde{y}_k\}$ each term $\tilde{y}_k$ is computed in order that $\tilde{F}(t)$ is a functional approximation of $F(t)$ in the interval $[t_k, t_{k+1}]$ by using a small finite number of previous values $y_k, y_{-1}, \ldots$. The previous values $y_k, y_{k-1}, \ldots$ are used to provide an estimation function that predicts the trend of $F(t)$ in the interval $[t_k, t_{k+1}]$. Let $p_k^m(t)$ be a polynomial approximation of $F(t)$ using $y_k$ and $m$ previous values. Then the predicted estimate to hold, $y_k^p$ is found by equating the integral of the estimation function in the interval $[t_k, t_{k+1}]$, $$\int_{t_k}^{t_{k+1}} p_k^m(t)dt$$

to the area under the constant value $hy_k^p$.

This choice of the predicted estimate makes the integrals of the polynomial estimation function and the constant function equal in the interval $[t_k, t_{k+1}]$. Provided the polynomial function is a close approximation of F(t) in the interval the error in the integral will be small. However, if the estimation is not close over the interval the integral of the polynomial over the interval will not be as close to the integral of F(t) as desirable. By using the actual value for $y_{k+1}$ once it is known, a correction for the overestimation or underestimation in the integral in the current interval can be used to adjust the value of the integral in the next interval.

Figure 2:
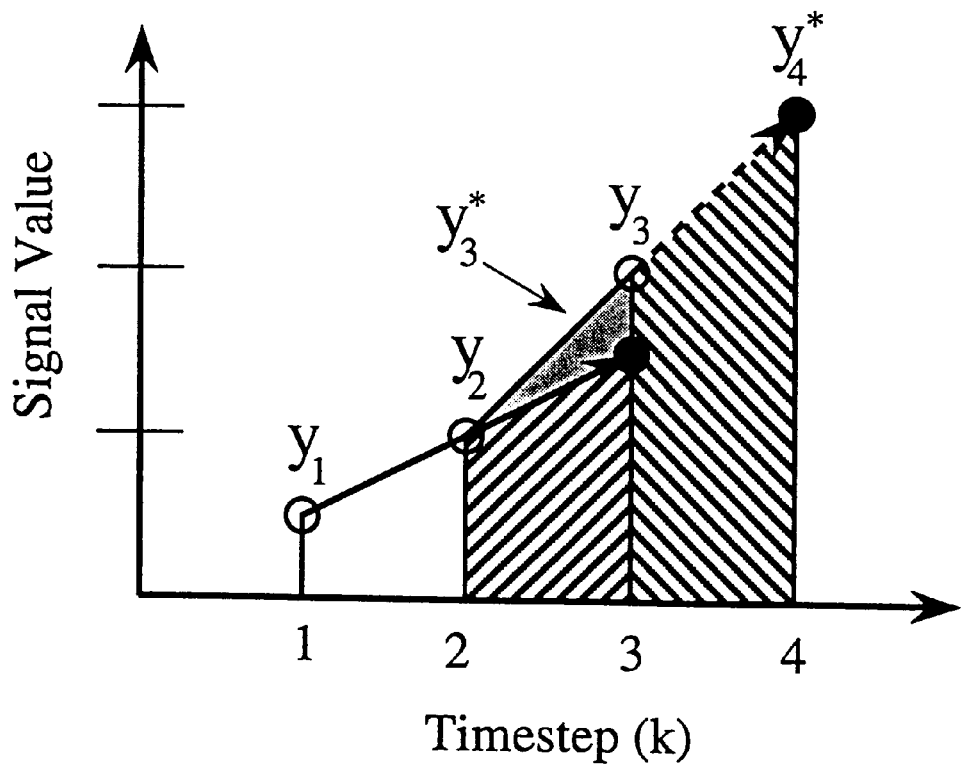
FIGS. 2 and 3 graphically illustrates the sample-estimate-hold method of reconstruction of a digital signal according to the present invention.
Figure 3:
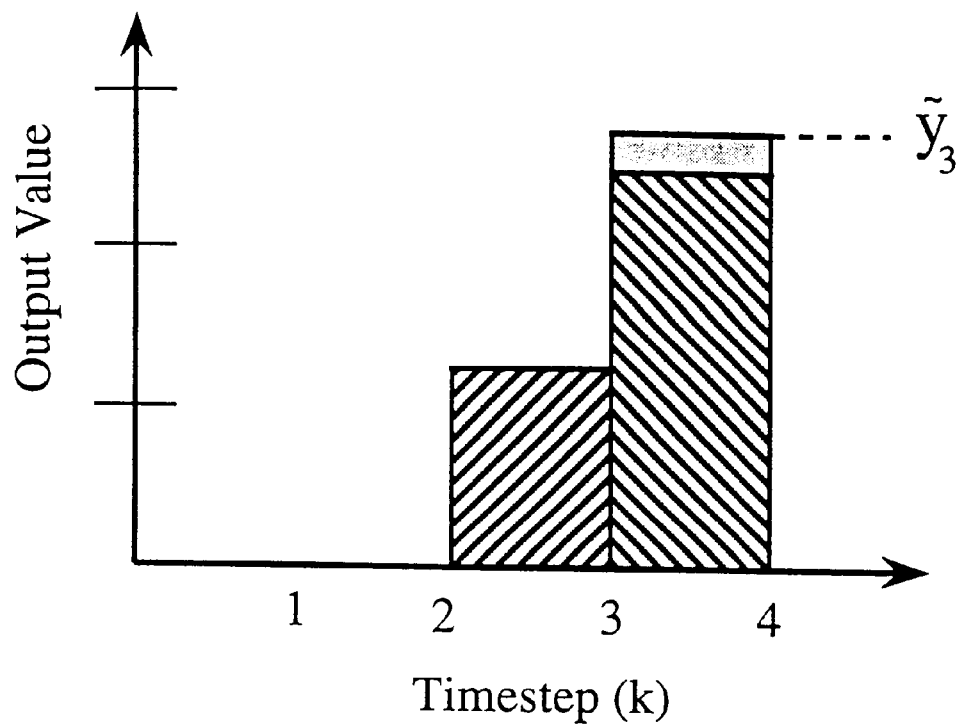

This is graphically illustrated by FIGS. 2 and 3. The correction in the current interval, $y_k^c$ is made by estimating the overestimation or underestimation of the integral in the previous interval using the polynomial $p_k^n(t)$ that approximates F(t) using $y_k$ and n previous values. The correction is determined by equating $$\int_{t_{k-1}}^{t_k} P_k^n(t)dt - hy_{k-1}^p$$

to $hy_k^c$. Thus, the final estimate for $\tilde{y}_k$ is given by $$\tilde{y}_k = y_k^p + y_k^c = \frac{1}{h}\left(\int_{t_k}^{t_{k+1}} p_k^m(t)dt + \int_{t_{k-1}}^{t_k} p_k^n(t)dt - \int_{t_{k-1}}^{t_k} p_{k-1}^m(t)dt\right)$$

The sample-estimate-hold method is determined by the choice of m and n. When m=0 and n=0, the constructed sequence is $\tilde{y}_0=y_0$, $\tilde{y}_k=2y_k-y_{k-1}$, k=1,2, ... $\mu$. There is no requirement that m and n be equal. Consider the case when m=0 and n=1. Then the constructed sequence is $$\tilde{y}_0 = y_0, \tilde{y}_k = \frac{1}{h}\left(hy_k + \frac{h}{2}(y_{k-1} + y_k) - hy_{k-1}\right) = \frac{3}{2}y_k - \frac{1}{2}y_{k-1}, k = 1, 2, ...$$

A simple practical case to treat is when both polynomial approximations are linear, i.e. m=1 and n=1. Then $$\int_{t_k}^{t_{k+1}} p_k^1(t)dt = \frac{h}{2}(y_k + y_{k+1}^*),$$

where $y^*_{k+1}=2h(y_k-y_{k-1})/h+y_{k-1}$. Thus, $$y_k^p = \frac{1}{2}(y_k + 2(y_k - y_{k-1}) + y_{k-1}) = \frac{3}{2}y_k - \frac{1}{2}y_{k-1}.$$

The corrector term is $$y_k^c = \int_{t_{k-1}}^{t_k} p_k^1(t)dt - hy_{k-1}^p =$$

$$\frac{1}{2}(y_{k-1} + y_k) - \left(\frac{3}{2}y_{k-1} - \frac{1}{2}y_{k-2}\right) = \frac{1}{2}(y_k - 2y_{k-1} + y_{k-2})$$

and the final estimate is $$\tilde{y}_k = y_k^p + y_k^c = 2y_k - \frac{3}{2}y_{k-1} + \frac{1}{2}y_{k-2}.$$

To begin the sequence, set $\tilde{y}_0=y_0$ and $\tilde{y}_1=2y_1-y_0$.

Figure 4:
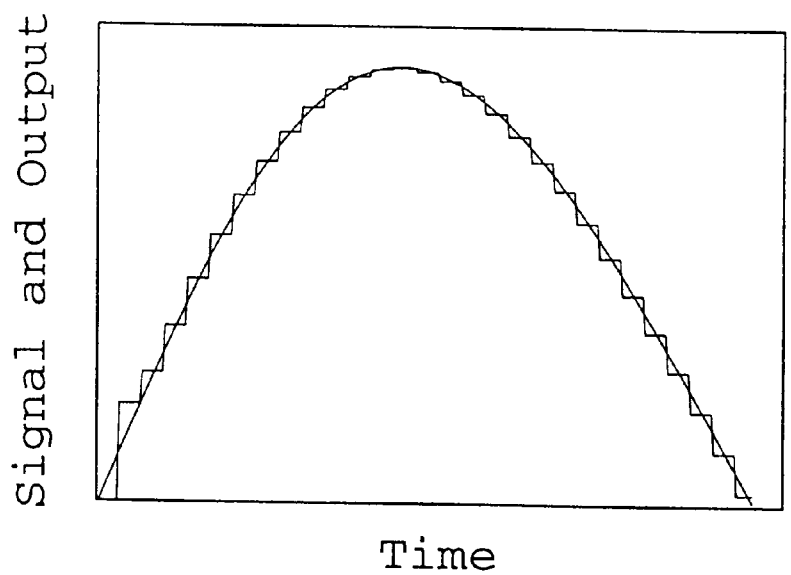
FIG. 4 shows the same continuous function as in FIG. 1 but with the reconstructed piecewise constant function being produced using the present sample-estimate-hold method.
Figure 5:
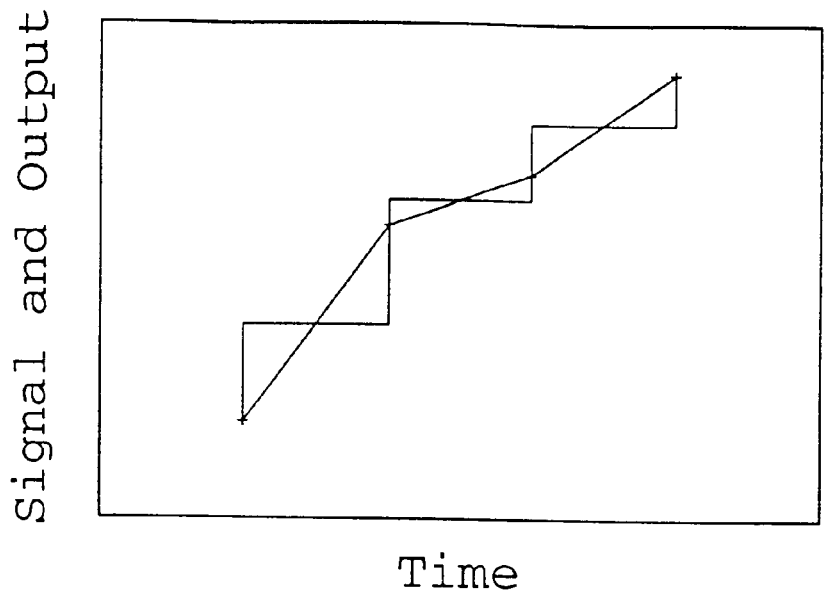
FIG. 5 illustrates a piecewise-linear polynomial that is approximated by an integral preserving stepwise function.

The sequence $\{\tilde{y}_k\}$ is the proposed sequence of constant values in the piecewise constant function $\tilde{F}(t)$ which has the property that its integral more accurately reflects the integral in local intervals of the underlying analog signal sampled as the sequence $\{y_k\}$. FIG. 4 shows the same continuous function as in FIG. 1 but with the reconstructed piecewise constant function being produced using the present sample-estimate-hold method. It can be seen that the reconstructed staircase function overlaps the continuous function being above it and below it.

In the foregoing analysis the numerical estimation of the sequence $\{y_k\}$ is based on using a predictor-corrector technique using polynomial approximations. However, the sample-estimate-hold methodology can use any numerical estimation that is designed to reduce the absolute difference between the integral of the original analog signal and the integral of its digital reconstruction in local intervals.

In the foregoing analysis a polynomial of order m is used in the predictor step to estimate the trend in the signal and a polynomial of order n is used in the corrector step to estimate the error in integration in the previous interval. However, it is noted that in a predictor-corrector scheme as disclosed herein there can be a lag in locking on to the trend. As the order of the approximation increases more previous samples are needed to produce the reconstructed signal so that there is potentially a trade-off between tracking lag and accuracy. Therefore, although higher order polynomials may be used, the inventors have found that for many of the different applications studied a first order estimation for both the predictor and corrector estimation polynomials works well.

The method uses the history of the analog signal being reconstructed from its digitized form to produce output values which reduce the absolute difference between the integral of the actual signal and the integral of its digital reconstruction in local intervals over the range of the signal.

The method disclosed herein utilizes the history of the signal being processed from its sampled data to give a better fit to the integral of the underlying continuous function represented by the digital sequence. By using knowledge at several previous sample points in the reconstruction, first and second derivative information in the signal is being captured and utilized to provide a more accurate reconstruction. From basic calculus, if the sampling interval is chosen sufficiently small, the signal reconstruction using the prior art sample-hold method can be made accurate to within any desired threshold. However, for practical applications other considerations such as storage space, bandwidth, or sampling limitations require that the sampling interval be chosen just small enough to provide the desired performance.

Thus, the sample-estimate-hold method disclosed herein is contemplated by the inventors to be useful in a broad range of applications where it can produce higher fidelity or reduce bandwidth or storage space. The sample-estimate-hold method disclosed herein for digital signal processing is very advantageous because it is simple, readily implemented and there is no need of parameter tuning: only the order of the prediction and correction functions needs to be selected. Non-limiting examples of the efficacy of the digital signal processing method disclosed herein as applied in several different technological applications will now be described.

EXAMPLE 1
Robotic Force Reflection Control

As briefly mentioned in the introduction, an important problem in the field of force-reflecting systems and telerobotics is poor rendering of contact, particularly of contact with stiff surfaces. There are numerous possible sources of poor performance, including poor contact models, sampling errors, and delays due to computation or data transmission. A haptic, or force-reflecting, interface is a device that can sense a human operator's hand motion, and actuate the operator with forces or torques, without significantly impeding the hand motion. The term "haptic" refers to both tactile and kinesthetic senses. These devices have been used for teleoperation of a remote robot, the characterization of human motor performance, conducting psychophysical experiments on haptics, and the interaction of a human with a virtual environment. There are many designs of devices that can provide stimuli for the haptic sense. A frequent observation of users is that the interactions feel "alive" or "active" which arises from the system providing more energy to the operator than is provided to the system, rather than feeling like a passive mechanical system.

The problem of liveliness often becomes very pronounced as the stiffness of the interaction increases, and can ultimately lead to an uncontrollable instability. Previous work on this liveliness problem has concentrated primarily on (a) providing more realistic models of contact for a simulated environment, (b) stabilizing effects due to delays in a teleoperation system, see R. J. Anderson and M. W. Spong; "Bilateral Control Of Teleoperators With a Time Delay", IEEE Transactions On Automatic Control", Vol 34(5), pp. 494–501, 1989, or (c) analysing effects of sampling errors. Colgate et al. designed a virtual wall composed of springs and dampers, see J. E. Colgate and G. Schenkel; "Passivity Of A Class Of Sample-Data Systems: Application To Haptic Interfaces", Proceedings of the American Control Conference, Baltimore Md. 1994, pp 3236–3240. In all cases, the main problem faced was how to obtain passivity in virtual walls. Some researchers have suggested that some criteria have to be defined on the basis of stiffness and damping coefficients in order to make the virtual wall passive, see M. Minsky, M. Ouh-Young and F. P. J. B. O. Steele, "Feeling And Sensing: Issues In Force Display", Computer Graphics, Vol. 24(2), pp. 235–243, 1990. Colgate and Schenkel provide a bound on the sampling frequency which, for a given force-reflecting system and a given virtual wall, will ensure passivity. Their model of system behaviour included zero-order hold in its usual form.

The inventors have found that the sample-and-hold method of reconstructing force reflection plays a significant part in the unrealistic presentation of contact information. Force-reflecting systems are computer controlled, so the forces of interaction are acquired at a finite rate. When the forces are reflected to the human operator, the combined operation of a digital-to-analog conversion and an amplifier amounts to a sample-and-hold of the reflected force. Using the technology now available, the effect is a fundamental property of both the discrete domain and of the physical interfaces of a computer to the world.

Applying the present sample-estimate-hold method of digital signal processing clarifies some of the issues that arise when implementing a force-reflecting system using a digital computer. The method is numerically based and is completely independent of the stiffness and damping coefficient of the virtual wall thereby allowing the creation of a transparent force rendering of a virtual wall, even of a wall that has zero damping. It is shown herebelow that the way a force signal is sampled is intimately related to the conservation of energy of a dynamical system. The sample-estimate-hold method is applied to the force reflecting control problem for calculating the reflected force while preserving the fundamental characteristic of the force. Adaptations of the methods are provided for the case of determining and reflecting forces at equal rates, and where the determination and reflection take place in integer ratios.

The importance of an accurate estimation of impulse in computing the energy transfer in a contact task is evident from an analysis of the dynamics equations governing the system. The dynamics equations of motion are derived from the Lagrangian of a one-degree-of-freedom mechanism but it will be understood that the derivation can be generalized. To derive the dynamics equations, a model is used comprising a one-degree-of-freedom force-reflecting system as a single link of mass m that has spatial coordinate q(t) and velocity coordinate q'(t). The Lagrangian equation of motion in the presence of a forcing function $f(t)$ is $mq''(t) = f(t) - c(q'(t)) - p(q(t))$ for a damping force c(q'(t)) and a potential force p(q(t)). The kinetic energy of the link at time can be calculated as $$E(t_1) = \frac{1}{2}\left(m\left(\int_{t_0}^{t_1} f(t)dt\right)\right)^2$$

in the case when there is no damping or potential energy present. This equation implies that, if a one-degree-of-freedom mechanism moves due just to an external forcing function, then errors in estimating the impulse over the time interval magnify the apparent energy quadratically. In the more general case of damped motion in a potential field this quadratic term will be altered by damping.

In a discretely sampled system the integral $$\int_{t_0}^{t_1} f(t)dt$$

is not directly observable but must be reconstructed from observations of $f(t)$. To maintain the principle of conservation of energy, the integral must closely approximate the true integral of the force during the sampling period. A particularly poor choice of the integral $$\int_{t_0}^{t_1} f(t)dt,$$

and the most commonly used method, is to sample $f(t_0)$ and hold it during the interval $[t_0, t_1]$ to produce the estimate $$\int_{t_0}^{t_1} f(t_0)dt \simeq f(t_0)(t_1 - t_0).$$

A major problem with this approach is any trends in $f(t)$ over the interval are ignored. This equation is the usual prior art sample-and-hold method that is used in many force-reflecting systems. A major problem is that the error introduced by using this equation to produce the estimate is magnified quadratically in the energy, as indicated in the previously developed equation.

The present sample-estimate-hold method is adapted to reduce the error introduced into the integral of the signal by the prior-art sample-and-hold method. As discussed more generally above, the method is disclosed using first-order polynomials in both the prediction and correction segments to approximate the force-time integral. However, the order of the polynomial used to predict and correct the integral may be higher, the prediction and the correction part need not use the same order of polynomial, and non-polynomial models may be used.

a) Equal-Time Sampling

Suppose that force is determined by acquisition from a sensor or generation from a numerical simulation over time, and is then reflected to a human operator. Assume that the sampling intervals of the determined force and the reflected force are fixed and identical, and let the sampling interval be h. The function F(t) is the smooth underlying function of force with time that is to be approximated from the force data obtained at sampling intervals. In the prior art sample-and-hold method, the integral $$\int_{t_k}^{t_{k+1}} F(t)dt$$

is approximated by $hy_k$. The present method is to use the previous force readings and the current to predict a new reading for the next instant. If the readings are used to extrapolate to a new reading, then the force-time integral for the upcoming interval can be estimated.

Following the general development described earlier, using linear functions for prediction and correction, let $\tilde{y}_k$ be the new zero-order-hold force that is to be output at time $t=t_k$ and let the estimated value for time $t=t_{k+1}$ be $y^*_{k+1}$: $y^*_{k+1} = 2y_k - y_{k-1}$. The force-time integral is then approximated as $$\int_{t_k}^{t_{k+1}} F(t)dt \simeq \frac{h}{2}(y_k + y^*_{k+1})$$

from which the new force value to be output is found from $$y_k^p = \frac{3}{2}y_k - \frac{1}{2}y_{k-1}.$$

However this equation does not account for the error incurred in the previous time instant by the prediction scheme. If this error is not taken into account the integral of F(t) will be incorrect. Similar to the general procedure described above, a correction term is calculated by estimating the integral from the previous instant to the current instant and subtracting from this area the area of the previous prediction. The graphical illustration of this technique is very similar to that shown in FIGS. 2 and 3 but with the ordinate axis being Force. The correction term is given by $$y_k^c = \frac{1}{2}(y_k - 2y_{k-1} + y_{k-2}).$$

Addition of the estimation term and the correction term gives $$\tilde{y}_k = 2y_k - \frac{3}{2}y_{k-1} + \frac{1}{2}y_{k-2}.$$

This last equation produces a new value of the force being sampled based on its previous zero-order representations. This new value of force, when held over the corresponding sampling interval, approximates the force-time integral locally over intervals of a few sample points more closely than the usual sample-and-hold value would. As a result, this new scheme introduces less error in the force-time integral. The error in the energy is quadratically less.

b) Rapid Output Sampling

Figure 6:
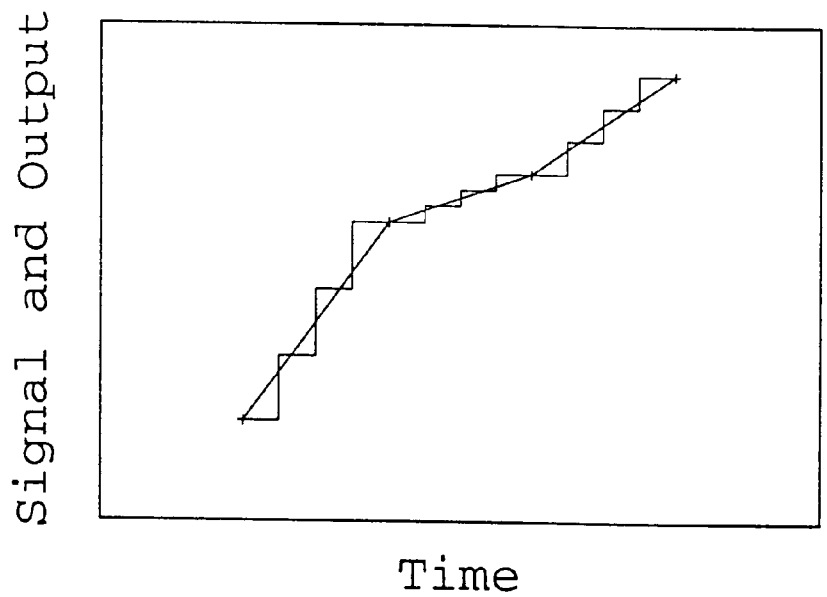
FIG. 6 illustrates a piecewise-linear polynomial that is approximated by a stepwise function at a higher sampling rate.

When a force reflecting system is used by a human operator to interact with a virtual environment, it is possible that the controller for the device can produce output forces at a higher rate than the dynamic simulator can calculate the forces. In such a situation, the force reflection can be further improved by careful use of the zero-order hold of the output force. Essentially, at a given instant the piecewise-linear prediction of the force to be output can be approximated by a series of steps shown in FIG. 6.

Let $h_i$ be the sampling interval for the input of forces (e.g. from a dynamics simulator or remote robotic sensor), and let $h_o$ be the sampling interval for output of forces to the motor amplifiers of the force-reflection system. Suppose $h_o$ and $h_i$ are related by $h_o = rh_i$ where r is a positive integer. As in the case of equal-time sampling where $\tilde{y}_k$ is chosen so that it approximates $$\frac{1}{h}\int_{t_k}^{t_{k+1}} F(t)dt,$$

with rapid output sampling, the integral $$\int_{t_k}^{t_{k+1}} F(t)dt$$

can be approximated by a plurality of stepwise approximations using a boundary condition that the force at time $t_{k+1}$ being given by the estimated value $y^*_{k+1}$. Then set an equation of force for each step $S_j$ equal to $S_j = y^*_{k+1} - \rho(r-1-j)$, for $j=0,1,\ldots,r-1$, where $\rho$ is an increment between steps. To maintain the same integral, set $$h_i \tilde{y}_k = \sum_{j=0}^{r-1} \frac{h_i}{r} S_j,$$

and substitute the right hand side of the above equation for $S_j$ into this equation and solve for $\rho$ to give $$\rho = 2.0 \frac{(y^*_{k+1} - \tilde{y}_k)}{(r-1)}.$$

The value of $\rho$ can then be found from this formula using the equations $y^*_{k+1} = 2y_k - y_{k-1}$ and $$\tilde{y}_k = 2y_k - \frac{3}{2}y_{k-1} + \frac{1}{2}y_{k-2}$$

from the predictor-corrector technique. Then ρ can be substituted into the right side of the equation for $S_j$ to derive an expression for $S_j$ in terms of current and previous determined forces. These output force values $S_j$ are provided to the force-reflecting system at a higher frequency than the acquisition in the relationship in $h_o=rh_i$. By doing so, the determined forces are extrapolated as a first-order polynomial which is then approximated by m stepwise-constant outputs.

c) Rapid Input Sampling

When the output rate is limited in order to avoid mechanical resonances or to avoid exceeding the mechanical bandwidth of the force-reflecting system the forces of interaction can be determined at a higher rate than they can be reflected. In this case, the inputs of a time interval can be used to form a better approximation of the smooth function that is assumed to be producing the determined forces.

Let $h_i$ be the sampling interval for force determination and $h_o$ be a sampling interval for force reflection, selecting the interval for force reflection to be $h_o=rh_i$ where r is an integer. Let $t=t_k$ denote the $k^{th}$ time that a reflected force value is calculated. Between times $t=t_{k-1}$ and $t=t_k$ there will be r+1 force values determined. These can be used in various ways but to be consistent with the linear-function approach these r+1 force values are used to construct a least-squares linear polynomial at time k given by $P_k(t)=\sigma_k t+\alpha_k$ where $\sigma_k$ and $\alpha_k$ are found by conventional regression equations. This polynomial $P_k(t)$ is used to estimate the integral $$\int_{t_k}^{t_{k+1}} F(t)dt \text{ by } \frac{h_o}{2}(P_k(t_k) + P_k(t_{k+1}))$$

to predict a value to be held. It is also used to estimate the integral $$\int_{t_{k-1}}^{t_k} F(t)dt \text{ by } \frac{h_o}{2}(P_k(t_{k-1}) + P_k(t_k)),$$

for use in the correction. The polynomial $P_{k-1}(t)$, used to predict in the previous interval is also used in determining the correction term. The prediction and correction terms are added together to obtain the output value $\tilde{y}_k$ given by $$\tilde{y} = \frac{1}{2}(P_k(t_k) + P_k(t_{k+1})) + \left[\frac{1}{2}(P_k(t_{k+1}) + P_k(t_k)) - \frac{1}{2}(P_{k-1}(t_{k-1}) + P_{k-1}(t_k))\right].$$

This equation can be simplified, or the quantities in parentheses can be calculated and used directly.

Validation of Methods for Robotic Force Reflection Control

Validation of the sample-estimate-hold method for force reflection was obtained using a light, low friction five-bar linkage two-degree-of-freedom planar haptic interface. The computer was a PC-compatible microcomputer (Intel 486 processor, 66 MHZ clock). The analog interfaces were provided by commercial boards that provided 12-bit conversion. The Cartesian position of the device handle was found by reading signals from the potentiometers attached to the motor shafts, converting from voltages to radians, and then using forward kinematics to find the position of the device tip. Reflection was performed by converting the desired Cartesian force to motor torques using the inverse Jacobian transformation. The desired torques were converted to desired voltage outputs by previously calibrating the combined sensitivity of the linear amplifiers and the actual motors used. To avoid mechanical resonances and to provide results that may be comparable to results from other devices all tests were conducted at a nominal sampling rate of 400 Hz. Clock jitter was less than 1%.

To ensure that the master mechanical system was passive the human operator was excluded from the tests and instead, the force-reflecting mechanism was tilted by approximately 15 degrees so that a diluted gravitational force acted on the mechanism. Four kinds of tests were conducted on a virtual wall of stiffness 0.35 N-mm. The wall stiffness value was chosen to be the stiffest attainable without reaching saturation of the analog-output stages. The reflection value was calculated as the penetration times the wall stiffness. The first test was a simple implementation of a virtual wall, in which penetration of a virtual wall was reflected immediately. The second test was implementation of the present sample-estimate-hold method designed for equal sampling intervals. The third test was implementation of the sample-estimate-hold method for rapid reflection, in which forces were determined at 400 Hz and reflected at 4000 Hz. The final test was implementation of the sample-estimate hold method for rapid determination, in which forces were determined at 4000 Hz and reflected at 400 Hz. For each test the displacements and reflection forces were logged and subsequently analysed. The area of the hysteresis curve, which is the difference in area from initial impact to maximum penetration and from maximum penetration to final exit, was calculated. The hysteresis results are presented in Table I. All results are for only the first, largest impact of the handle position with the virtual wall.

TABLE I

Hysteresis Values From Experiments

| Case | Energy Loss (mJ) |
|---|---|
| Uncompensated | −1.214 |
| Equal Sampling | −0.027 |
| Multiple Reflections | +0.903 |
| Multiple Acquisitions | +0.951 |

Figure 7:
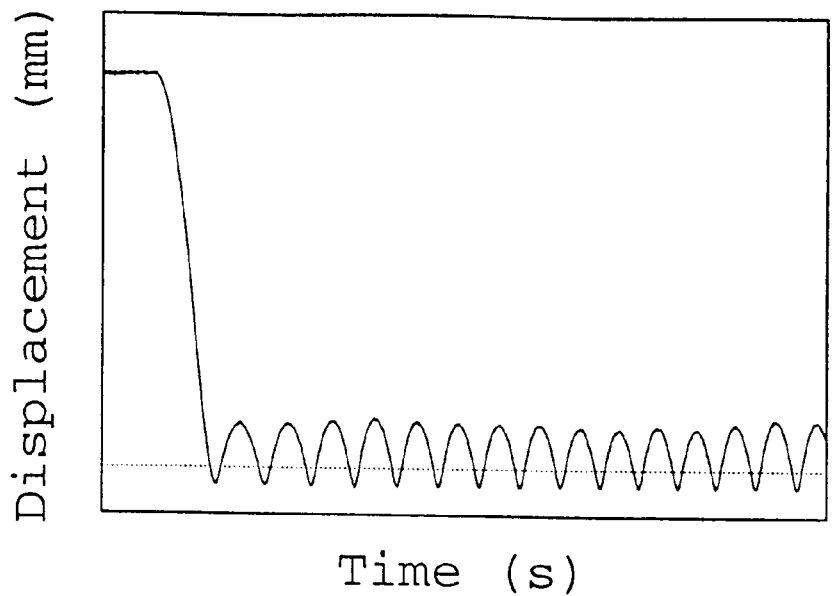
FIG. 7 illustrates the time-displacement behaviour of the virtual-wall impact using sample-and-hold on equal intervals.
Figure 8:
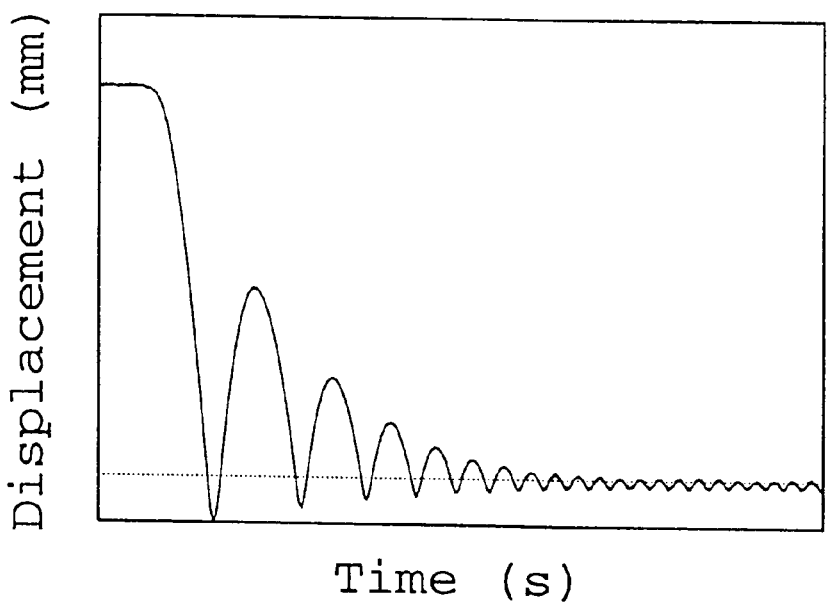
FIG. 8 illustrates the time-displacement behaviour of the virtual-wall impact using sample-estimate-hold on equal intervals.
Figure 9:
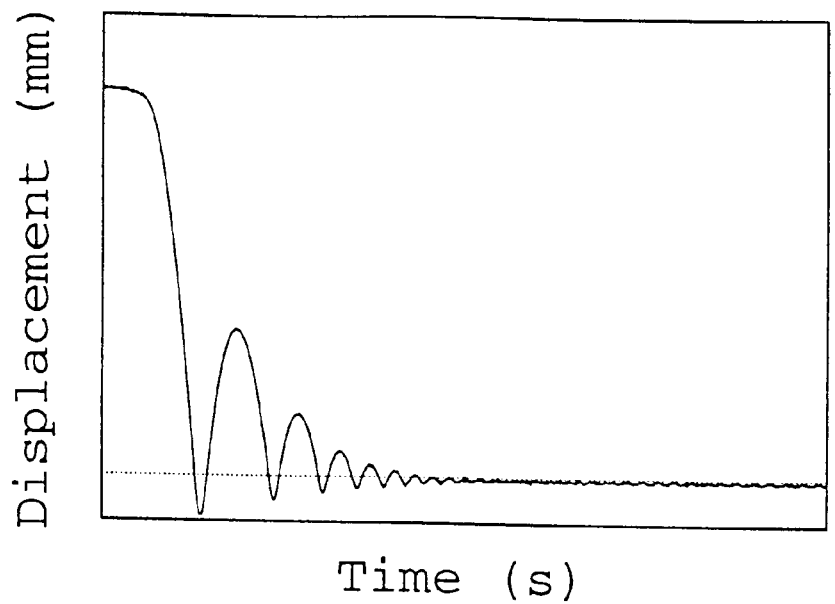
FIG. 9 shows the time-displacement behaviour of the virtual-wall using sample-estimate-hold, producing reflected forces 10 times for each force that was determined.
Figure 10:
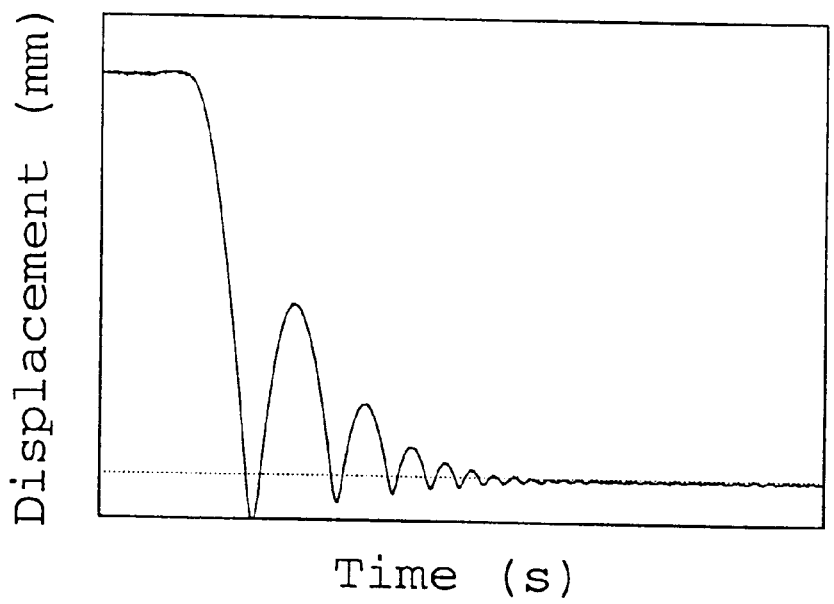
FIG. 10 illustrates the time-displacement behaviour of the virtual-wall impact using sample-estimate-hold, determining forces 10 times for each force reflection.

As can be seen from the hysteresis results in Table I, the prior art sample-hold reflection method adds significant energy to the simulated impact of the mechanism with a virtual wall. The sample-estimate-hold method for equal sampling adds very little energy, and the other methods with unequal sampling actually absorb energy to effectively dampen the impact. In the presence of a potential field (e.g. gravity) it is expected that the energy provided by an active wall would eventually balance the potential energy of peak rebound, that is, a limit cycle is expected. This is confirmed by the displacement-time plots that display exactly this expected phenomenon. FIG. 7 shows a perpetual-motion bounce of 5 mm magnitude when sample-hold is used while FIG. 8 shows that, with sample-estimate-hold, the bounce magnitude is reduced to less than a millimeter. FIG. 9 gives an experimental demonstration of the passivity of the sample-estimate-hold method for rapid reflection, and FIG. 10 demonstrates the passivity for rapid determination. The results clearly show that the sample-estimate-hold method significantly reduces the excess energy injected into the system by the prior art sample-and-hold method.

Stabilization is distinctly improved by increasing the sampling rate in either the force determination stage or the force reflection stage because the sample-estimate-hold methods take considerable advantage of the additional information available. In other words the present methods make use of the additional information available and provide better performance than is available by slowing down the overall system to achieve synchronization. Tracking in these cases is not perfect but it will be appreciated that it is far better than in using sample-and-hold to reflect contact forces.

The present method is advantageous over known filtering methods since the latter typically employ several tuning parameters that must be adjusted for each implementation whereas, with the present sample-estimate-hold method, once the order of the method is chosen then all other parameters are completely determined thereby eliminating the need for parameter tuning. A particularly advantageous aspect of this method is the ability to improve performance in a system where the acquisition and reflection rates differ.

The sample-estimate-hold methodology has a wide range of potential applications in robotics and may be used wherever zero-order sampling is required. For example, sampling and estimating position or velocity input to a controller, or implementing force control in a traditional manipulator all require the sampling of signals. The inventors also contemplate that the method disclosed herein may be used to examine to provide solutions to problems that arise from time delay.

EXAMPLE 2
Reproduction of Digital Acoustic Signals

Acoustic signals may be viewed as analog signals in which air pressure is applied against a transducer such as the ear or microphone. A loudspeaker applies a force to a diaphragm which then variably pressurizes the volume of air in the listening area in reconstructing the same forces originally experienced by the microphone. Therefore, energy conservation is an important consideration for improved audio signal reconstruction for the same reasons that use of energy conservation is important in the method for reconstruction of the forces in the robotic force reflection application in Example 1.

Digital Music Signal

A digital music sample was taken from a compact disk and converted to a monaural signal, 16 bits per sample, with an original sampling rate of 44.1 kHz on a SUN workstation. An algorithm embodying the sample-estimate-hold method was applied to the digital music sample to produce a reconstructed analog music signal. The reconstructed music sample was crisper at higher frequencies and appeared, based on qualitative analysis, to provide a more realistic sound for various musical instruments.

Figure 11:
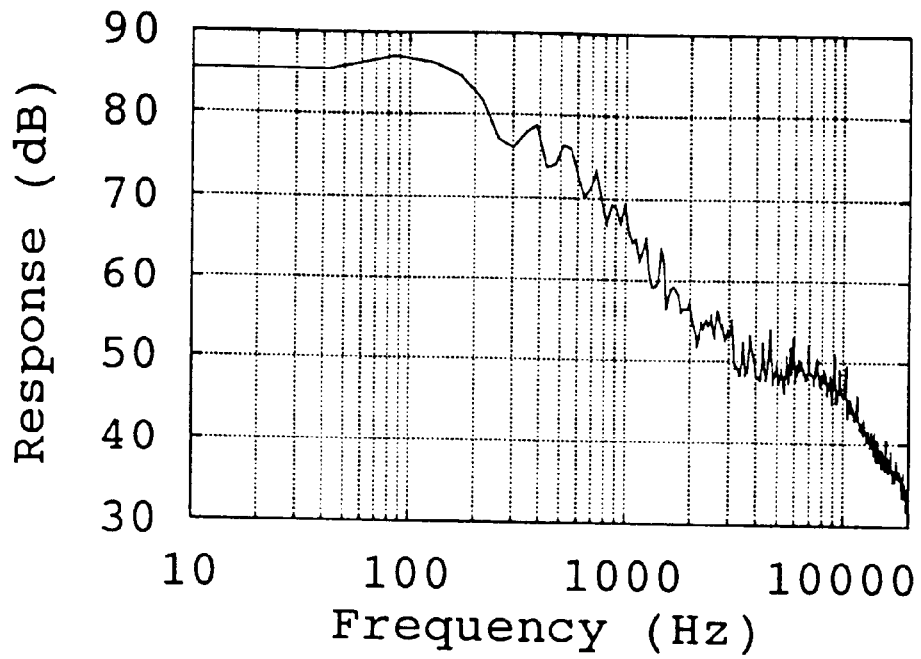
FIG. 11 is a plot of power spectral density of an original music signal.
Figure 12:
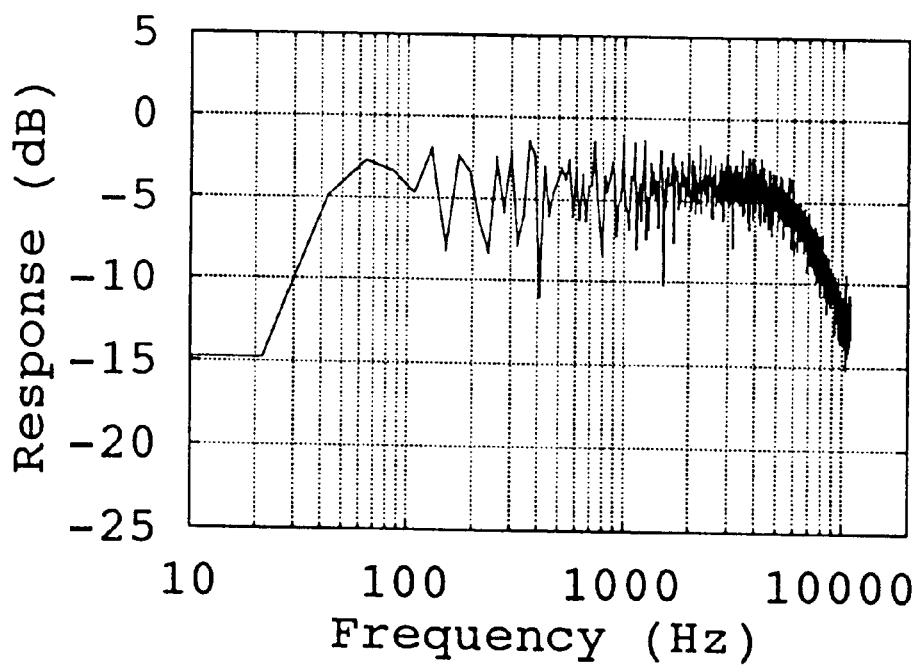
FIG. 12 is a plot of the difference in power spectral density of the zero-order-hold representation of the filtered and subsampled music signal, using the prior art method of digital reproduction, and the original music signal of FIG. 11.
Figure 13:
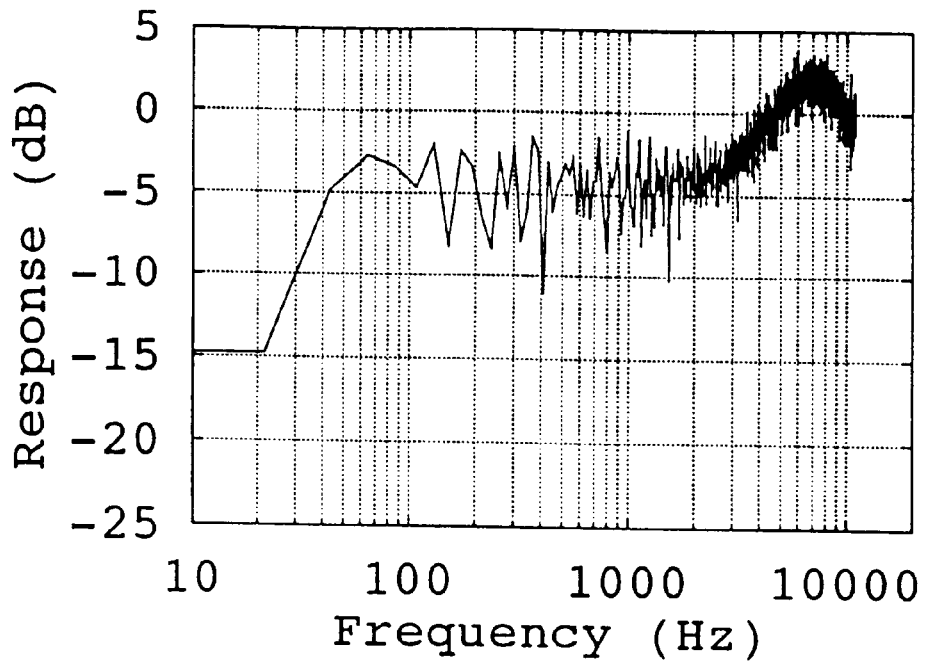
FIG. 13 is a plot of the difference in power spectral density of the music signal reconstructed using the present sample-estimate-hold method after filtering and subsampling and the original music signal of FIG. 11.

The following subsampling test was conducted to show that the music signal reconstructed using the present sample-estimate-hold method better reflects the original audio signal before it was digitized. In the test the assumption is made that the original digital sample using the sample-hold process is the target signal to reproduce. Then a digital signal at ½ of the frequency is selected to represent the digitization of the target signal. It is well known by those skilled in the art that just sampling at ½ the rate will introduce sampling bias. A second order Butterworth filter, with a cut-off frequency of 7 kHz and Hanning windowing, was used to remove the high frequencies, and the subsample at 22.05 kHz was selected. This produced a loss of intermediate frequencies due to the filtering in addition to the truncation of the high frequencies by the sampling. The power spectrum of the original music signal is shown in FIG. 11. FIGS. 12 and 13 give the difference between the power spectra of the filtered then subsampled and the filtered then subsampled then reconstructed music signals, respectively, and the original music signal. FIG. 12 shows that the result of the prior art sample-hold reconstruction of the subsampled signal loses about 5 dB in the middle frequencies, but is noticeably poorer when compared to the original signal in the higher frequencies. FIG. 13 illustrates the performance of the present sample-estimate-hold process applied to the filtered and subsampled signal wherein the higher frequencies have been lifted to more closely mimic the target signal.

Two important conclusions can be drawn from this subsampling experiment. First, using a combination of filtering, subsampling and the sample-estimate-hold reconstruction method disclosed herein, a 2-to-1 compression of the audio signal is achieved with very little degradation in sound quality. This confirms that a 50% improvement in bandwidth is achievable for audio music signals, or conversely substantially twice the sound fidelity is achievable for the same bandwidth. The second conclusion is that using the sample-estimate-hold reconstruction of the original digital music signal is most likely producing a reconstruction that is closer to the original analog music signal.

Digital Voice

Figure 14:
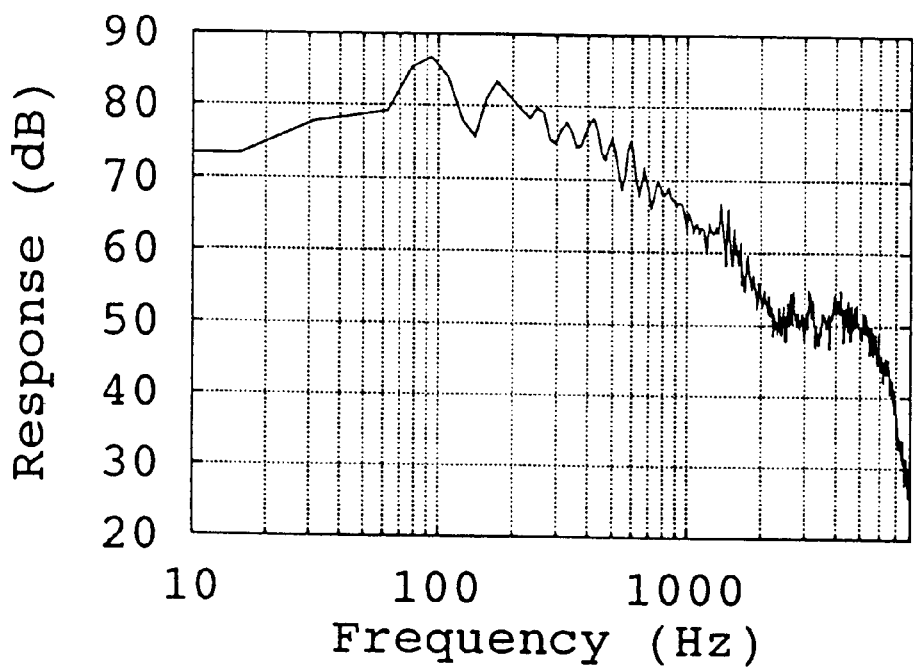
FIG. 14 is a plot of power spectral density of an original voice signal.
Figure 15:
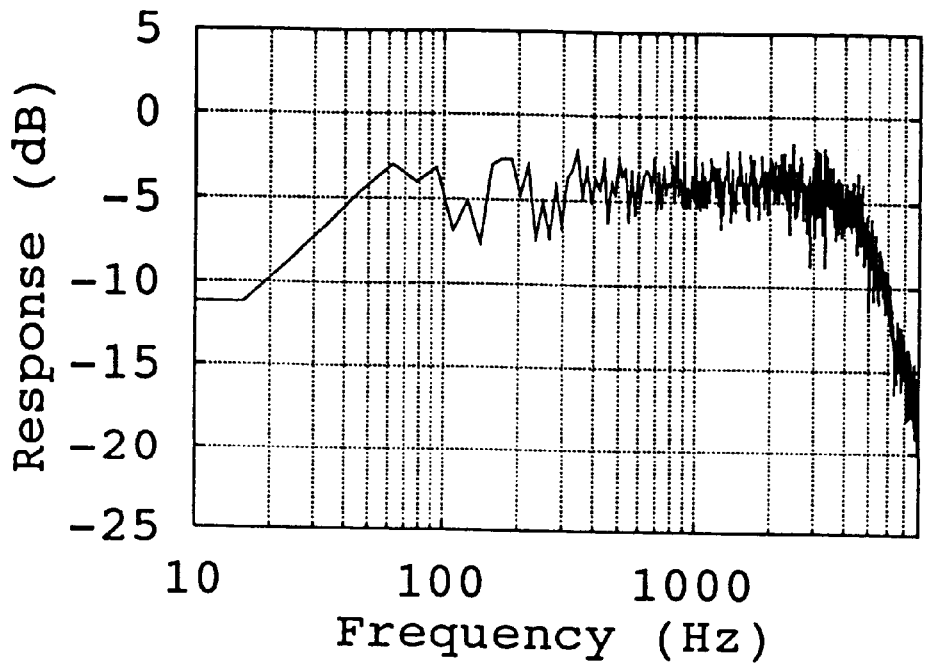
FIG. 15 is a plot of the difference in power spectral density of the zero-order-hold representation of the filtered and subsampled voice signal, using the prior art method of digital reproduction, and the original voice signal of FIG. 14.
Figure 16:
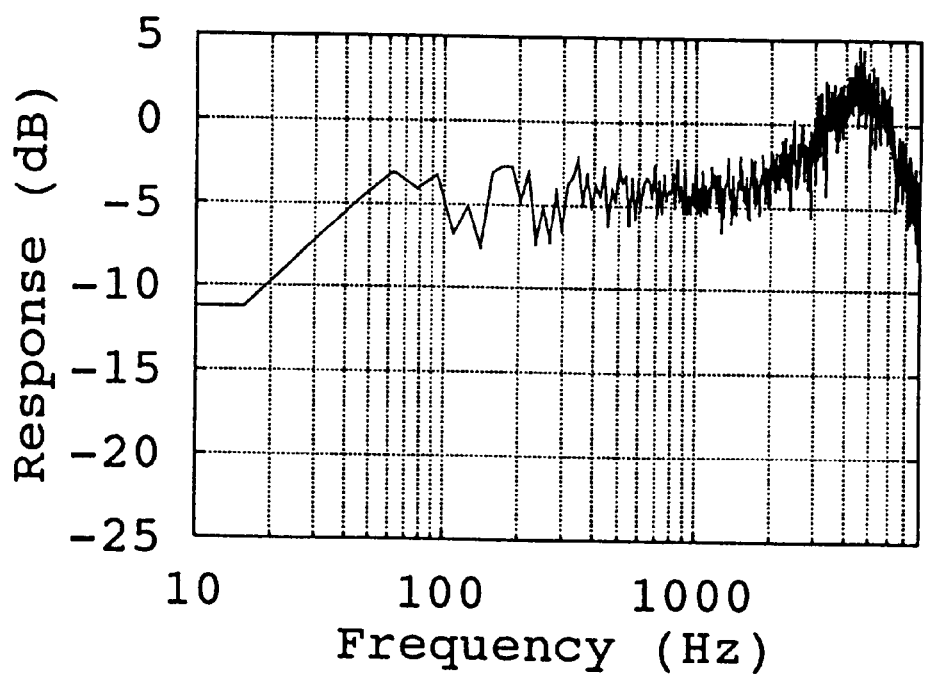
FIG. 16 is a plot of the difference in power spectral density of the voice signal reconstructed using the present sample-estimate-hold method after filtering and subsampling and the original voice signal of FIG. 14.

A digital voice sample was recorded on an analog cassette and then sampled using a 16-bit sound board on an IBM compatible PC to obtain a monaural signal with 16 bits per sample at a sampling rate of 16 kHz. Two subsampling tests were conducted. In the first the voice signal is compressed by a process of filtering and subsampling to obtain a 2-to-1 compression and then reconstructed to produce a signal that is much crisper than the filtered and subsampled voice signal and quite close to the uncompressed signal in quality. The digital voice signal was filtered with a 3rd-order Butterworth filter with a cut-off frequency of 2.5 kHz was used and the signal was subsampled to 8 kHz. This produced a loss of intermediate frequencies due to the filtering in addition to the truncation of the high frequencies by the sampling. The power spectrum of the original voice signal is shown in FIG. 14. FIGS. 15 and 16 give the difference between the power spectra of the filtered then subsampled, the filtered then subsampled then reconstructed voice signals, respectively, and the original voice signal. FIG. 15 shows that the result of the prior art sample-hold reconstruction of the subsampled signal loses about 5 dB in the middle frequencies, but is noticeably poorer when compared to the original signal in the higher frequencies. FIG. 16 illustrates the performance of the present sample-estimate-hold process applied to the filtered and subsampled signal wherein the higher frequencies have been lifted to closely mimic the target signal.

The second subsampling test achieves a further compression by using a logarithmic amplitude encoding of the filtered and subsampled signal. In this test the 16 bit 8 kHz signal was compressed to 8 bits using the mu-law representation. This achieved a further 2-to-1 compression of the voice signal. Then the 8-bit mu-law representation was decompressed and the sample-estimate-hold reconstruction was used to produce a 16 bit, 8 kHz signal that has a frequency spectrum that is almost identical to the sample-estimate-hold reconstruction from the first test.

An important conclusion can be drawn from this subsampling experiment. In using a combination of filtering, subsampling and the sample-estimate-hold reconstruction method disclosed herein, a 2-to-1 compression of the voice audio signal is achieved with only a little degradation in sound quality. In applications where transmission bandwidth or storage space is critical, a further 2-to-1 compression can be achieved by using a prior-art logarithmic amplitude compression method in conjunction with the sample-estimate-hold method disclose herein.

$$\bar{b} = \begin{bmatrix} b_x \\ b_y \\ b_z \end{bmatrix}, \bar{r} = \frac{\bar{b}}{\|\bar{b}\|}, \cos(\theta) = \frac{(\operatorname{trace}(R) - 1)}{2}$$

so that the transformation T is a rotation about $\bar{r}$ by angle $\theta$ followed by a displacement d. A reconstructed rotation axis $\tilde{r}(t)$ is produced using the present sample-estimate-hold method in which each element of the vector $\tilde{r}(t)$ is computed independently. Next, a reconstructed rotation angle $\tilde{\theta}(t)$ is produced using the sample-estimate-hold method. The reconstructed rotation axis is normalized then a reconstructed matrix $\tilde{R}(t)$ is computed from the normalized reconstructed rotation axis by computing the reverse transformation $$\tilde{R} = \begin{bmatrix} (r_x^2(1-\cos(\tilde{\theta}))) + \cos(\tilde{\theta}) & (r_x r_y(1-\cos(\tilde{\theta}))) - r_z \sin(\tilde{\theta}) & (r_x r_z(1-\cos(\tilde{\theta}))) + r_y \sin(\tilde{\theta}) \\ (r_x r_y(1-\cos(\tilde{\theta}))) + r_z \sin(\tilde{\theta}) & (r_y^2(1-\cos(\tilde{\theta}))) + \cos(\tilde{\theta}) & (r_y r_z(1-\cos(\tilde{\theta}))) - r_x \sin(\tilde{\theta}) \\ (r_x r_z(1-\cos(\tilde{\theta}))) - r_y \sin(\tilde{\theta}) & (r_y r_z(1-\cos(\tilde{\theta}))) + r_x \sin(\tilde{\theta}) & (r_z^2(1-\cos(\tilde{\theta}))) + \cos(\tilde{\theta}) \end{bmatrix}$$

where $\tilde{r}(t) = \begin{bmatrix} r_x(t) \\ r_y(t) \\ r_z(t) \end{bmatrix}$.

EXAMPLE 3
Point of View Positioning in Virtual Reality

An interactive visual display of virtual environments typically uses a 3D head-tracking system to determine how the virtual scene is to be rendered. A common problem in such systems is that the head tracking exhibits lag. This lag may be significantly reduced using the present sample-estimate-hold process to provide a better reconstruction of the viewer's motion.

Rendering a fixed scene from a mobile viewpoint using computer graphics involves a rigid-body transformation of every scene point that is to be drawn. To transform a point $\bar{x}$ in scene coordinates to viewer coordinates, the transformation is typically expressed in the form $T(\bar{x}_i,t) = R(t)\bar{x}_i + \bar{d}(t)$ where R is an orthogonal rotation matrix and d is a translational displacement vector.

Applying the present sample-estimate-hold process directly to the orthogonal rotation matrix R is not advisable since the resultant matrix will not in general be orthogonal. It is preferable to compute the unit rotation axis $\bar{r}(t)$ and rotation angle $\theta(t)$ from the matrix R(t). Given R, define a skew-symmetric matrix $B = (R - R^T)/2$ where $R^T$ is a transposed matrix of the matrix R. B is of the form $$B = \begin{bmatrix} 0 & -b_z & b_y \\ b_z & 0 & -b_x \\ -b_y & b_x & 0 \end{bmatrix}.$$

From this define a scaled and unit rotation axis and a rotation angle respectively as The efficacy of the sample-estimate-hold process was qualitatively established by rendering a complex scene at 25 Hz using a head-mounted display. The lag normally accompanying the traditional method was significantly reduced and in particular the vertigo-inducing effects were dramatically reduced.

While the sample-estimate-hold method forming the present invention has been described and illustrated with respect to several digital signal processing applications, those skilled in the art will appreciate that the present method can be applied to may other signal processing applications, and as such, they are covered by the claims as defined herebelow.

What is claimed is:

1. A method of reconstructing an analog signal from a digitized analog signal, comprising;

providing sample values $y_k$ of an analog signal function of time F(t) such that $y_k = F(t_0 + kh)$ where h is the sampling interval, $t_0$ is the initial time and $k = 0,1,2,\ldots\mu$, defining a piecewise constant function of time given by $H(t) = y_k$, $t_k \leq t < t_{k+1}$;

constructing an output analog signal function $\tilde{F}(t) = \tilde{y}_k$, $t_k \leq t < t_{k+1}$, $k = 0,1,2,\ldots\mu$, by computing a sequence $\{\tilde{y}_k\}$ in real time using an effective numerical estimation technique so that an absolute difference given by $|\int \tilde{F}(t)dt - \int F(t)dt|$ is less than an absolute difference given by $|\int H(t)dt - \int F(t)dt|$ locally in intervals defined by a preselected number of previous sample values $y_k$; and outputting said reconstructed analog signal function $\tilde{F}(t)$ or storing said sequence $\{\tilde{y}_k\}$ in a digital storage medium for subsequent relieving and outputting in analog form.

2. The method according to claim 1 wherein each term $\tilde{y}_k$ is computed as a functional approximation of F(t) in an interval $[t_k, t_{k+1}]$ by calculating an estimation function $g_k(t)$ that predicts F(t) in the interval $[t_k, t_{k+1}]$ by using an effective number of previous values $y_k, y_{k-1}, \ldots$ and integrating said estimation function over the interval $[t_k, t_{k+1}]$ to give $$\int_{t_k}^{t_{k+1}} g_k(t)dt$$

calculating a predicted value to hold using an equation $$y_k^p = \frac{1}{h}\left(\int_{t_k}^{t_{k-1}} g_k(t)dt\right),$$

calculating a correction term by using an estimation function $e_k(t)$ to estimate the integral in the previous interval $[t_{k-1}, t_k]$ and subtracting the predicted area estimation in that interval, said correction being given by $$y_k^c = \frac{1}{h}\left(\int_{t_{k-1}}^{t_k} e_k(t)dt - \int_{t_{k-1}}^{t_k} g_{k-1}(t)dt\right),$$

and adding said correction term to said predicted value to give a value for $\tilde{y}_k$ given by $$\tilde{y}_k = \frac{1}{h}\left(\int_{t_k}^{t_{k+1}} g_k(t)dt + \int_{t_{k-1}}^{t_k} e_k(t)dt - \int_{t_{k-1}}^{t_k} g_{k-1}(t)dt\right).$$

3. The method according to claim 2 wherein the estimation function $g_k(t)$ equals $p_k^m(t)$, which is the polynomial approximation of order m that fits F(t) at values $y_k, y_{k-1}, \ldots, y_k^m$, and wherein the estimation function $e_k(t)$ equals $p_k^n(t)$ which is the polynomial approximation of order n that fits F(t) at values $y_k, y_{k-1}, \ldots, y_{k-n}$.

4. The method according to claim 3 wherein said sample values $\{\tilde{y}_k\}$ of the analog signal function of time F(t) are digitized from an audio analog signal so that said reconstructed signal is an audio signal.

5. The method according to claim 4 wherein said analog signal function is music, said digitized audio signals are stored in a storage medium and said reconstructed audio signal is music.

6. The method according to claim 5 wherein said storage medium include but are not limited to compact discs, digital audio tapes, magnetic discs, and magnetic optical discs.

7. The method according to claim 4 wherein said analog signal function is audio voice and said reconstructed audio signal is a voice signal.

8. The method according to claim 3 wherein m=1 and n=1 and then $$\tilde{y}_k = 2y_k - \frac{3}{2}y_{k-1} + \frac{1}{2}y_{k-2}.$$

9. The method according to claim 8 wherein the step of providing sample values $y_k$ of said signal function comprises providing said sample values at a rate faster than the rate at which said reconstructed signal function is outputted, letting $h_i$ be the sampling interval for signal sampling and $h_o$ be a sampling interval for signal reconstruction, selecting the interval for signal reconstruction to be $h_o = rh_i$ where r is an integer, letting $t=t_k$ denote the $k^{th}$ time that a reconstructed signal value is calculated, constructing an estimation polynomial at time k given by $P_k(t)=\sigma_k t+\alpha_k$ by calculating $\sigma_k$ and $\alpha_k$ using effective regression equations, using said polynomial $P_k(t)$ to estimate the integral $$\int_{t_{k-1}}^{t_k} F(t)dt \text{ by } \frac{h_0}{2}(P_k(t_k) + P_k(t_{k+1}))$$

to predict a value to be held and to estimate the integral $$\int_{t_{k-1}}^{t_k} F(t)dt \text{ by } \frac{h_0}{2}(P_k(t_{k-1}) + P_k(t_k)),$$

and using the polynomial $P_{k-1}(t)$ from the previous interval to calculate a correction term, and adding the prediction and correction terms together to compute the output value $\tilde{y}_k$ given by $$\tilde{y} = \frac{1}{2}(P_k(t_k) + P_k(t_{k+1})) + \left[\frac{1}{2}(P_k(t_{k-1}) + P_k(t_k)) - \frac{1}{2}(P_{k-1}(t_{k-1}) + P_{k-1}(t_k))\right].$$

10. The method according to claim 8 wherein the step of providing sample values $y_k$ of said signal function comprises providing said sample values at a rate slower than the rate at which said reconstructed signal function is outputted, letting $h_i$ be a sampling interval for signal reconstruction and $h_o$ be a sampling interval for signal reconstruction, selecting the interval for signal reconstruction to be $h_o=rh_i$ where r is an integer, approximating the integral $$\int_{t_k}^{t_{k-1}} F(t)dt$$

by a plurality of stepwise approximations using a boundary condition that the reconstruction at time $t_{k+1}$ being given by $y^*_{k+1}$, setting an equation of reconstruction for each step $S_j$ equal to $S_j y^*_{k+1} - \rho(r-1-j)$, j=0, . . . ,r-1, where $\rho$ is an increment between steps given by $$\rho = 2.0\frac{(y^*_{k+1} - \tilde{y}_k)}{(r-1)},$$

and wherein the step of outputting said reconstructed analog signal includes outputting said reconstructed signal values $S_j$ or storing said reconstructed signal values in said digital storage medium.

11. The method according to claim 3 wherein m=0 and n=1 and then $$\tilde{y}_k = \frac{3}{2} y_k - \frac{1}{2} y_{k-1}.$$

12. The method according to claim 2 wherein said analog signal function F(t) is a force signal acquired from a sensor means or a numerical simulation over time and the reconstructed signal function $\tilde{F}(t)$ is reflected to a human operator, and wherein the step of providing sample values $y_k$ of said analog signal function comprises providing said sample values at a rate faster than the rate at which said reconstructed signal function is outputted, letting $h_i$ be the sampling interval for force acquisition and $h_o$ be a sampling interval for force reflection, selecting the interval for force reflection to be $h_o=rh_i$ where r is an integer, letting $t=t_k$ denote the $k^{th}$ time that a reflected force value is calculated, constructing an estimation polynomial at time k given by $P_k(t)=\sigma_k t+\alpha_k$ by calculating $\sigma_k$ and $\alpha_k$ using effective regression equations, using said polynomials $P_k(t)$ to estimate the integral $$\int_{t_{k-1}}^{t_k} F(t)dt \text{ by } \frac{h_0}{2}(P_k(t_k)+P_k(t_{k+1}))$$

to predict a value to be held and to estimate the integral $$\int_{t_{k-1}}^{t_k} F(t)dt \text{ by } \frac{h_0}{2}(P_k(t_{k-1})+P_k(t_k)),$$

and using the polynomial $P_{k-1}(t)$ from the previous interval to calculate a correction term, and adding the prediction and correction terms together to compute the output value $\tilde{y}_k$ given by $$\tilde{y} = \frac{1}{2}(P_k(t_k)+P_k(t_{k+1})) + \left[\frac{1}{2}(P_k(t_{k-1})+P_k(t_k)) - \frac{1}{2}(P_{k-1}(t_{k-1})+P_{k-1}(t_k))\right].$$

13. The method according to claim 12 wherein said force signal is acquired from a sensor means or a numerical simulation over time.

14. The method according to claim 2 wherein said analog signal function F(t) is a force signal and the reconstructed signal function $\tilde{F}(t)$ is reflected to a human operator, and wherein the step of providing sample values $y_k$ of said signal function comprises providing said sample values at a rate slower than the rate at which said reconstructed signal function is outputted, letting $h_i$ be a sampling interval force acquisition and $h_o$ be a sampling interval for output of forces to an activator forming part of a force reflection system, selecting the interval for force reflection to be $h_o=rh_i$ where r is an integer, approximating the integral $$\int_{t_k}^{t_{k+1}} F(t)dt$$

by a plurality of stepwise approximations using a boundary condition that the force at time $t_{k+1}$ being given by $y^*_{k+1}$, setting an equation of force for each step $S_j$ equal to $S_j = y^*_{k+1} - \rho(r-1-j)$, $j=0,\ldots,r-1$ where $\rho$ is an increment between steps given by $$\rho = 2.0 \frac{(y^*_{k+1} - \tilde{y}_k)}{(r-1)},$$

and wherein the step of outputting said reconstructed signal function includes outputting said output force values $S_j$ to said force reflecting system.

15. The method according to claim 14 wherein said force signal is acquired from a sensor means or a numerical simulation over time.

16. The method according to claim 2 wherein said analog signal F(t) is a force signal acquired from a sensor means or a numerical simulation over time and the reconstructed signal function $\tilde{F}(t)$ is reflected to a human operator, and wherein h is the sampling interval for said force and the reconstructed signal function reflected to said operator.

17. The method according to claim 2 wherein said sample values $\{\tilde{y}_k\}$ of the analog signal function of time F(t) are digitized from an audio analog signal so that said reconstructed signal is an audio signal.

18. The method according to claim 1 wherein said sample values $\{\tilde{y}_k\}$ of the analog signal function of time F(t) are digitized from an audio analog signal so that said reconstructed signal is an audio signal.

19. A method for compression of an analog signal, comprising;

a) sampling said analog signal at a first frequency $v_1$ or relieving from a storage medium an analog signal previously sampled at frequency $v_1$ to produce a digitized signal, filtering said digitized signal to remove frequencies above a preselected frequency, subsampling the filtered signal at a second frequency $v_2$ wherein $v_2 < v_1$;

b) reconstructing said analog signal from said digitized signal sampled at frequency $v_2$, by the steps of providing sample values $y_k$ of said analog signal of time F(t) such that $y_k=F(t_0+kh)$ where h is the sampling interval, $t_0$ is the initial time and $k=0,1,2,\ldots,\mu$, defining a piecewise constant function of time given by $H(t)=y_k$, $t_k \leq t < t_{k+1}$ constructing a sequence $\{\tilde{y}_k\}$ in real time where $\tilde{y}_k$, $k=0,1,2,\ldots\mu$ are computed values of a piecewise constant function of time $\tilde{F}(t)$ forming a reconstruction of said signal function such that $\tilde{F}(t)=\tilde{y}_k$, $t_k \leq t < t_{k+1}$, $k=0,1,2,\ldots,\mu$, wherein said sequence $\{\tilde{y}_k\}$ is computed by using an effective numerical estimation technique so that an absolute difference given by $|\int \tilde{F}(t)dt - \int F(t)dt|$ locally in intervals defined by a preselected number of previous sample values $y_k$ is less than an absolute difference given by $|\int H(t)dt - \int F(t)dt|$ over the same intervals; and c) outputting said reconstructed analog signal $\tilde{F}(t)$ or storing said sequence $\{\tilde{y}_k\}$ in a digital storage medium for subsequent relieving and outputting in analog form.

20. The method according to claim 19 wherein said analog signal is an audio signal.

21. The method according to claim 20 wherein each term $\tilde{y}_k$ is computed as a functional approximation of F(t) in an interval $[t_k, t_{k+1}]$ by calculating an estimation function $g_k(t)$ that predicts F(t) in the interval $[t_k, t_{k+1}]$ by using an effective number of previous values $y_k, y_{k-1}, \ldots$ and integrating said estimation function over the interval $[t_k, t_{k+1}]$ to give $$\int_{t_k}^{t_{k+1}} g_k(t)dt$$

calculating a predicted value to hold using an equation $$y_k^p = \frac{1}{h}\left(\int_{t_k}^{t_{k+1}} g_k(t)dt\right),$$

calculating a correction term by using an estimation function $e_k(t)$ to estimate the integral in the previous interval $[t_{k-1}, t_k]$ and subtracting the predicted area estimation in that interval, said correction being given by $$y_k^c = \frac{1}{h}\left(\int_{t_{k-1}}^{t_k} e_k(t)dt - \int_{t_{k-1}}^{t_k} g_{k-1}(t)dt\right),$$

and
adding said correction term to said predicted value to give a value for $\tilde{y}_k$ given by $$\tilde{y}_k = \frac{1}{h}\left(\int_{t_k}^{t_{k+1}} g_k(t)dt + \int_{t_{k-1}}^{t_k} e_k(t)dt - \int_{t_{k-1}}^{t_k} g_{k-1}(t)dt\right).$$

22. The method according to claim 21 wherein the estimation function $g_k(t)$ equals $p_k^m(t)$, which is the polynomial approximation of order m that fits F(t) at values $y_k, y_{k-1}, \ldots, y_{k-m}$, and wherein the estimation function $e_k(t)$ equals $p_k^n(t)$, which is the polynomial approximation of order n that fits F(t) at values $y_k, y_{k-1}, \ldots, y_{k-n}$.

23. The method according to claim 22, wherein m=0 and n=1 and then $$\tilde{y}_k = \frac{3}{2}y_k - \frac{1}{2}y_{k-1}.$$

24. The method according to claim 23 wherein said audio signal is music, said first frequency $v_1$ is about 44.1 kHz and said second frequency $v_2$ is about 22.05 kHz.

25. The method according to claim 23 wherein said audio signal is voice, said first frequency $v_1$ is about 16 kHz and said second frequency $v_2$ is about 8 kHz.

26. The method according to claim 22 wherein m=1 and n=1 and then $$\tilde{y}_k = 2y_k - \frac{3}{2}y_{k-1} + \frac{1}{2}y_{k-2}.$$

27. The method according to claim 26 wherein said audio signal is music, said first frequency $v_1$ is about 44.1 kHz and said second frequency $v_2$ is about 22.05 kHz.

28. The method according to claim 22 wherein said audio signal is music, said first frequency $v_1$ is about 44.1 kHz and said second frequency $v_2$ is about 22.05 kHz.

29. The method according to claim 22 wherein said audio signal is voice, said first frequency $v_1$ is about 16 kHz and said second frequency $v_2$ is about 8 kHz.

30. The method according to claim 21 wherein said audio signal is music, said first frequency $v_1$ is about 44.1 kHz and said second frequency $v_2$ is about 22.05 kHz.

31. The method according to claim 21 wherein said audio signal is voice, said first frequency $v_1$ is about 16 kHz and said second frequency $v_2$ is about 8 kHz.

32. A method of reconstructing an analog signal from a digitized analog signal, comprising;

providing sample values $y_k$ of an analog signal function of time F(t) such that $y_k=F(t_0+kh)$ where h is the sampling interval, $t_0$ is the initial time and $k=0,1,2,\ldots\mu$;

constructing an output analog signal function $\tilde{F}(t)=\tilde{y}_k$, $t_k \leq t < t_{k+1}, k=0,1,2,\ldots\mu$, by computing a sequence $\{\tilde{y}_k\}$ in real time, wherein each term $\tilde{y}_k$ is computed as a functional approximation of F(t) in an interval $[t_k, t_{k+1}]$ by the steps of calculating an estimation function $g_k(t)$ that predicts F(t) in the interval $[t_k, t_{k+1}]$ using an effective number of previous values $y_k, y_{k-1}, \ldots$ and integrating said estimation function over the interval $[t_k, t_{k+1}]$ to give $$\int_{t_k}^{t_{k+1}} g_k(t)dt,$$

and calculating a predicted value to hold $y_k^p$ given by $$y_k^p = \frac{1}{h}\left(\int_{t_k}^{t_{k+1}} g_k(t)dt\right),$$

calculating a correction term by using an estimation function $e_k(t)$ to estimate the integral in the previous interval $[t_{k-1}, t_k]$ and subtracting the predicted area estimation in that interval, said correction being given by $$y_k^c = \frac{1}{h}\left(\int_{t_{k-1}}^{t_k} e_k(t)dt - \int_{t_{k-1}}^{t_k} g_{k-1}(t)dt\right), \text{ and}$$

adding said correction term to said predicted value to give a value for $\tilde{y}_k$ given by $$\tilde{y}_k = \frac{1}{h}\left(\int_{t_k}^{t_{k+1}} g_k(t)dt + \int_{t_{k-1}}^{t_k} e_k(t)dt - \int_{t_{k-1}}^{t_k} g_{k-1}(t)dt\right);$$

outputting said reconstructed analog signal function $\tilde{F}(t)$ or storing said sequence $\{\tilde{y}_k\}$ in a digital storage medium for subsequent relieving and outputting in analog form.

33. The method according to claim 27 wherein the estimation function $g_k(t)$ equals $p_k^m(t)$, which is the polynomial approximation of order m that fits F(t) at values $y_k, y_{k-1}, \ldots, y_{k-m}$, and wherein the estimation function $e_k(t)$ equals $P_k^n(t)$, which is the polynomial approximation of order n that fits F(t) at values $y_k, y_{k-1}, \ldots, y_{k-n}$.

\* \* \* \* \*